(12) United States Patent  (10) Patent No.: US 9,311,989 B2
Sridhara  (45) Date of Patent: Apr. 12, 2016

(54) POWER GATE FOR LATCH-UP PREVENTION

(71) Applicant: Texas Instruments Incorporated, Dallas, TX (US)

(72) Inventor: Srinivasa Raghavan Sridhara, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/331,648

(22) Filed: Jul. 15, 2014

(65) Prior Publication Data

US 2016/0019945 A1 Jan. 21, 2016

(51) Int. Cl.
*G11C 11/40* (2006.01)
*G11C 11/417* (2006.01)
*G11C 11/412* (2006.01)
*G11C 5/14* (2006.01)

(52) U.S. Cl.
CPC .............. *G11C 11/417* (2013.01); *G11C 5/148* (2013.01); *G11C 11/412* (2013.01)

(58) Field of Classification Search
CPC .......... G11C 5/14; G11C 5/148; G11C 11/40; G11C 11/412; G11C 11/417; G11C 11/4072; G11C 11/4074
USPC ............................................. 365/154, 63, 226
See application file for complete search history.

(56) References Cited

U.S. PATENT DOCUMENTS

| | | | | |
|---|---|---|---|---|
| 6,188,628 B1* | 2/2001 | Tomotani | ................. | G11C 5/14 365/226 |
| 6,301,184 B1* | 10/2001 | Sasaki | ................. | G11C 7/1045 365/226 |
| 8,385,149 B2* | 2/2013 | Yang | ..................... | G11C 11/417 365/154 |
| 2003/0076705 A1* | 4/2003 | Yamaoka | ............... | G11C 5/146 365/154 |
| 2011/0261609 A1* | 10/2011 | Seshadri | .............. | G11C 11/417 365/154 |
| 2013/0294149 A1* | 11/2013 | Deng | ....................... | G11C 5/14 365/156 |

* cited by examiner

*Primary Examiner* — Tan T. Nguyen
(74) *Attorney, Agent, or Firm* — John R. Pessetto; Frank D. Cimino

(57) ABSTRACT

In an embodiment of the invention, power is provided to an SRAM array without causing latch-up by charging the positive voltage node in the SRAM array and the Nwell regions in the SRAM at approximately the same rate.

6 Claims, 5 Drawing Sheets

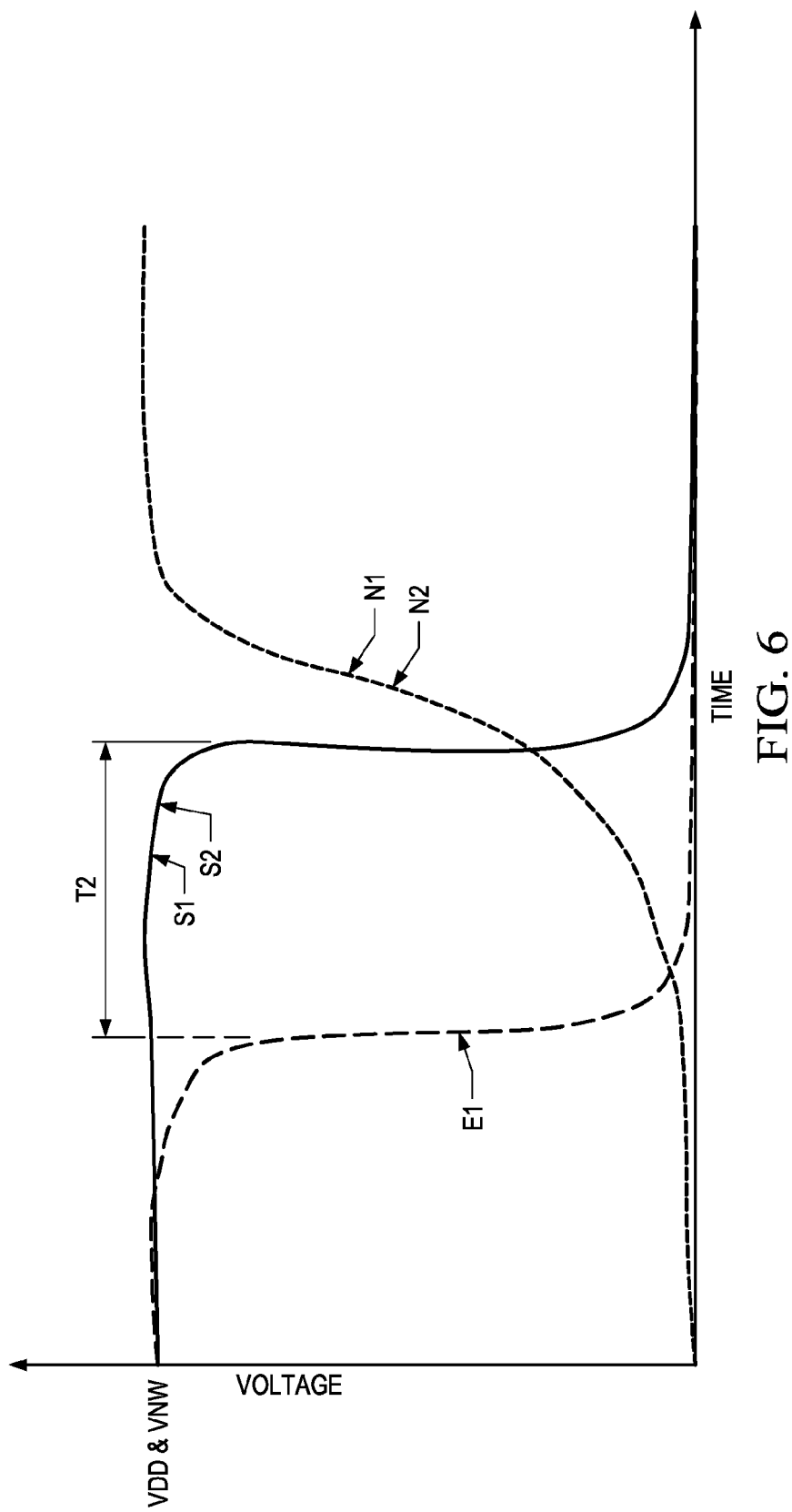

POWER GATE FOR LATCH-UP PREVENTION

BACKGROUND

CMOS (Complementary Metal-Oxide Semiconductor) circuits usually include PFETs (P-type Field-Effect Transistor) and NFETs (N-type Field-Effect Transistor). Usually, a PFET is formed in an Nwell (n-type region). The source of the PFET is usually connected to a power supply with a voltage VDD. The source of the PFET is usually p-type material. The Nwell where the PFET is formed is usually connected to the power supply VDD as well. Because the source of the PFET and the Nwell are both connected to VDD, the P/N junction (i.e. a diode) formed at the interface of the source of the PFET and the Nwell is not forwarded biased. Since the P/N junction is not forward biased, latch-up should not occur in this area.

As stated previously, the source of a PFET and the Nwell where the PFET is formed are usually connected to VDD. However, in some cases (e.g. testing of SRAM cells), the voltage applied at the Nwell of a PFET is different from the voltage VDD. In order to prevent latch-up in these cases, it is important that the P/N junction formed by the source of a PFET and the Nwell not be forward-biased during this testing or when powering up a circuit to operate at normal operating voltages.

BRIEF DESCRIPTION OF THE SEVERAL VIEWS OF THE DRAWING

FIG. 6 is timing diagram illustrating the timing of the signals S1 and E1 used to charge node N1 and N2 according to an embodiment of the invention.

DETAILED DESCRIPTION OF THE INVENTION

In an embodiment of the invention, power is provided to an SRAM array without causing latch-up by charging the positive voltage node in the SRAM array and the Nwell regions in the SRAM at approximately the same rate.

This invention will be described in connection with certain of its embodiments, namely as implemented into static random access memory (SRAM) array in which the memory cells are constructed in a 6-T arrangement (shown in FIG. 2) because it is contemplated that this invention is especially beneficial when applied to such circuits. However, it is also contemplated that other memory circuits and architectures, including SRAM cells of different construction, may also benefit from this invention. Accordingly, it is to be understood that the following description is provided by way of example only, and is not intended to limit the true scope of this invention as claimed.

As mentioned above, this invention is suitable for use in connection with semiconductor memory circuits, whether serving as a stand-alone integrated circuit or as embedded into larger scale integrated circuits such as microprocessors, microcontrollers, or the so-called "system on a chip" (SoC) integrated circuits. Examples of embodiments of this invention in memory will be described in this specification, it being understood that such descriptions of implementations of this invention are not to be interpreted in a limiting fashion.

Figure 1:
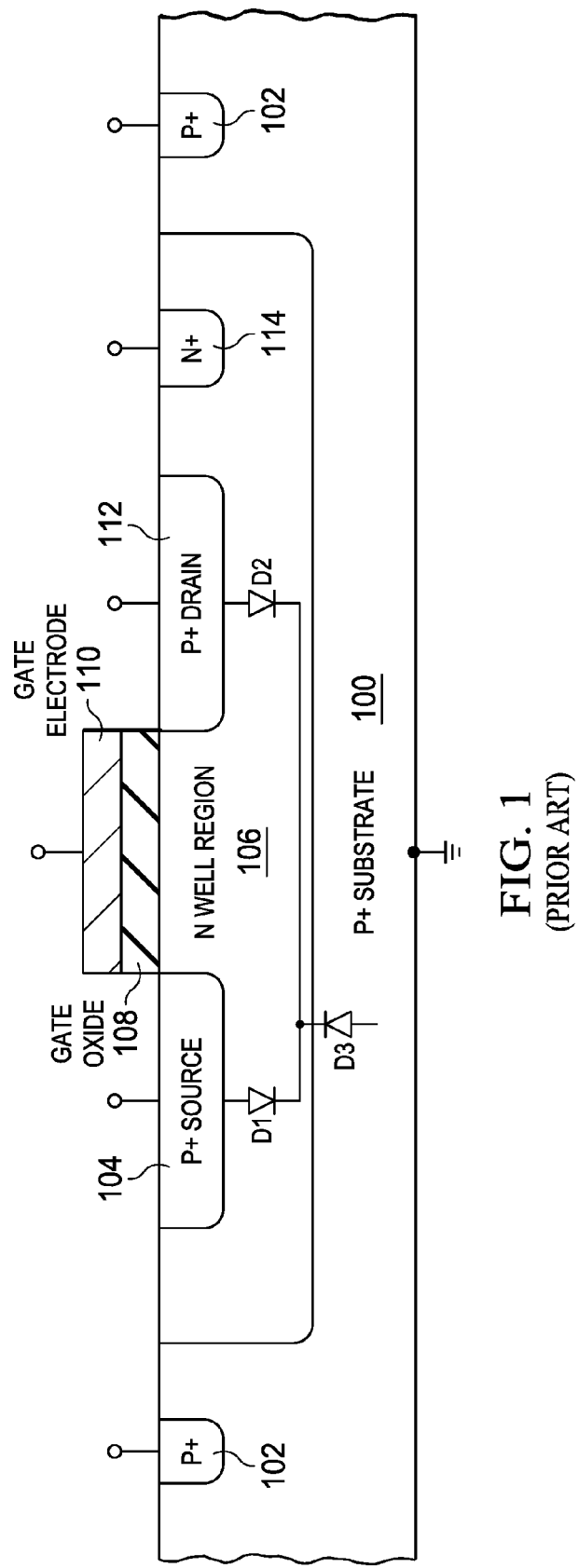
FIG. 1 is an integrated circuit section view of the P-type Field-Effect transistor (PFET), 212 in FIG. 2, illustrating the source and drain regions, the N-type well region, the P-type substrate, and the associated parasitic diodes. (Prior Art)
Figure 2:
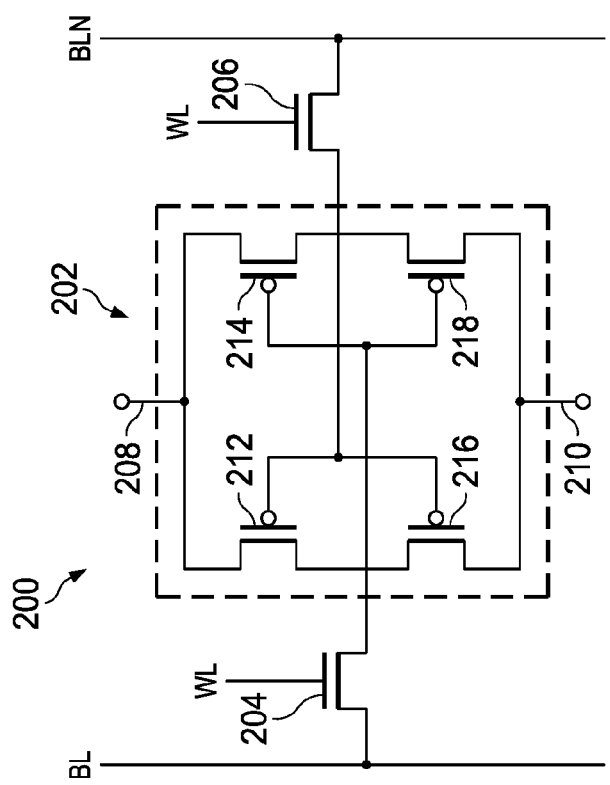
FIG. 2 is an electrical schematic of a six-transistor SRAM (static random access memory) cell. (Prior Art)

FIG. 1 is an integrated circuit section view of the P-type Field-Effect transistor (PFET), 212 in FIG. 2, illustrating the source and drain regions, the N-type well region, the P-type substrate, and the associated parasitic diodes. In the integrated circuit section view of FIG. 1, it can be seen that PFET 212 includes P-type source region 104 and a P-type drain region 112 formed in N-type well (Nwell) region 106, which is formed on P-type substrate 100. A gate oxide 108 is formed over the P-type channel region extending immediately under gate oxide 108 from the edge of the P-channel source region 104 to the edge of the P-channel drain region 112. A gate electrode 110 is formed on the upper surface of gate oxide 108. An N+ contact region 114 allows low-resistance electrical contact to Nwell 106, and P+ regions 102 allow low-resistance context to P+ substrate 100. Parasitic diode D1 includes the P/N junction between source region 104 and Nwell region 106. Parasitic diode D2 includes the P/N junction between drain region 112 and well region 106 and substrate diode D3 includes the P/N junction between substrate region 100 and Nwell region 106.

During operation of PFET 212, it is important that diodes D1, D2 and D3 be reversed-biased to prevent latch-up. To keep diode D1 reverse-biased the voltage on the source region 104 should be equal to or lower than the voltage on the Nwell region 106. In many circuit configurations, this done by connecting the source region 104 to a positive voltage VDD and the Nwell region 106 to a positive voltage VDD. Diode D2 is kept in the reverse-biased mode when the voltage on the drain region 112 is equal to or lower than the voltage on the Nwell region 106. Usually the Nwell region is held at a positive voltage VDD and the drain region 112 does not have a voltage higher than VDD so diode D2 remains reverse-biased during operation. Diode D3 is kept in the reverse-biased mode when the voltage on the substrate region 100 is equal to or lower than the voltage on the Nwell region 106. Usually the Nwell region is held at a positive voltage VDD and the substrate region 100 is grounded so diode D3 remains reverse-biased during operation.

FIG. 2 is an electrical schematic of a six-transistor SRAM (static random access memory). The six-transistor SRAM cell 200 shown in FIG. 2 includes a latch 202 and two transfer transistors 204 and 206. The latch 202 is connected between the latch sourcing supply line 208 and the latch sinking supply line 210. The latch 202 includes two PMOS (p-type channel metal-oxide semiconductor) transistors 212 and 214 and two NMOS (n-type channel metal-oxide semiconductor) transistors 216 and 218. The gates of transistors 212 and 216 are electrically connected to the drains of transistors 214, 218 and 206. The sources of the two PMOS transistors 212 and 214 are electrically connected to the latch sourcing supply line 208. The sources of the two NMOS transistors 216 and 218 are electrically connected to the latch sinking supply line 210. The gates of transistors 214 and 218 are electrically connected to the drains of transistors 212, 216 and 204. The word line WL is connected to the gates of the two transfer transistors 204 and 206. The source of transfer transistor 204 is connected to bit line BL and the source of transfer transistor 206 is connected to bit line BLN.

Figure 3:
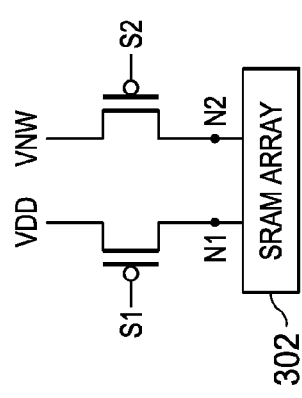
FIG. 3 is an electrical schematic of a circuit for providing power to the positive voltage node N1 of an SRAM array and to the Nwells N2 of the SRAM array. (Prior Art)

FIG. 3 is an electrical schematic of a circuit for providing power to the positive voltage node N1 of an SRAM array and to the Nwells N2 of the SRAM array 302. In this example, PFETs MP1 and MP2 provide power to the positive voltage node N1 and the Nwells N2 of the SRAM array respectively. When signal S1 is driven to a logical zero, the voltage on N1 is approximately VDD. When signal S2 is driven to a logical zero, the voltage on N2 is approximately VNW.

Figure 4:
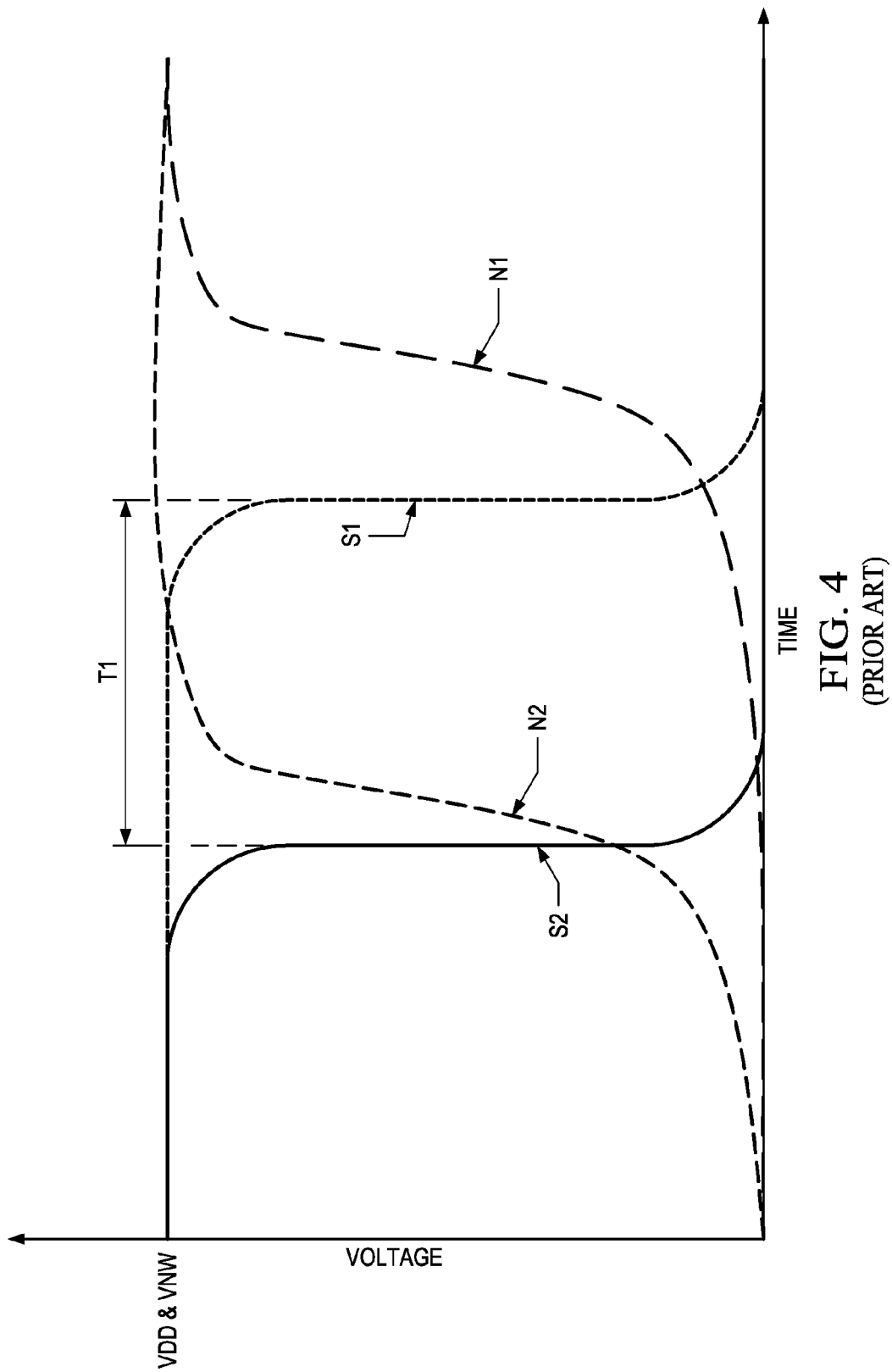
FIG. 4 is a timing diagram illustrating the timing of the signals S1 and S2 used to charge node N1 and N2 respectively. (Prior Art)

FIG. 4 is timing diagram illustrating the timing of the signals S1 and S2 used to charge nodes N1 and N2 respectively. In order to prevent latch-up, S2 is driven to a logical zero a time T1 before signal S1 is driven to a logical zero. Because S2 is driven to a logical zero a time T1 before signal S1 is driven to a logical zero, node N2 to is driven to voltage VNW before node N1 is driven to VDD. In this example, voltage VNW is approximately the same value as VDD. Because the Nwells N2 of the SRAM array 302 are driven to VNW before the positive node N1 of the SRAM array 302 is driven to VDD, latch-up will not occur.

Figure 5:
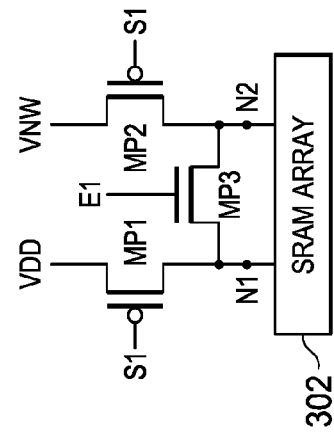
FIG. 5 is an electrical schematic of a circuit for providing power to a positive node N1 of an SRAM array and to the Nwells N2 of the SRAM array according to an embodiment of the invention.

FIG. 5 is an electrical schematic of a circuit for providing power to a positive node N1 of an SRAM array and to the Nwells N2 of the SRAM array according to an embodiment of the invention. In this example, PFETs MP1 and MP2 provide power to the positive voltage node N1 and the Nwells N2 of the SRAM array respectively. When PFET MP3 is driven to a logical zero, the voltages on node N1 and N2 become approximately equal.

FIG. 6 is timing diagram illustrating the timing of the signals S1 and E1 used to charge node N1 and N2 according to an embodiment of the invention. In order to prevent latch-up, E1 is driven to a logical zero a time T2 before signal S1 is driven to a logical zero. Because E1 is driven to a logical zero a time T2 before signal S1 is driven to a logical zero, nodes N1 and N2 are driven to approximately the same voltage at approximately the same time. In this example, voltage VNW is approximately the same value as VDD. Because the Nwells N2 of the SRAM array 302 and the positive node N1 of the SRAM array 302 are driven to approximately the same voltage at approximately the same time, latch-up will not occur.

Figure 7:
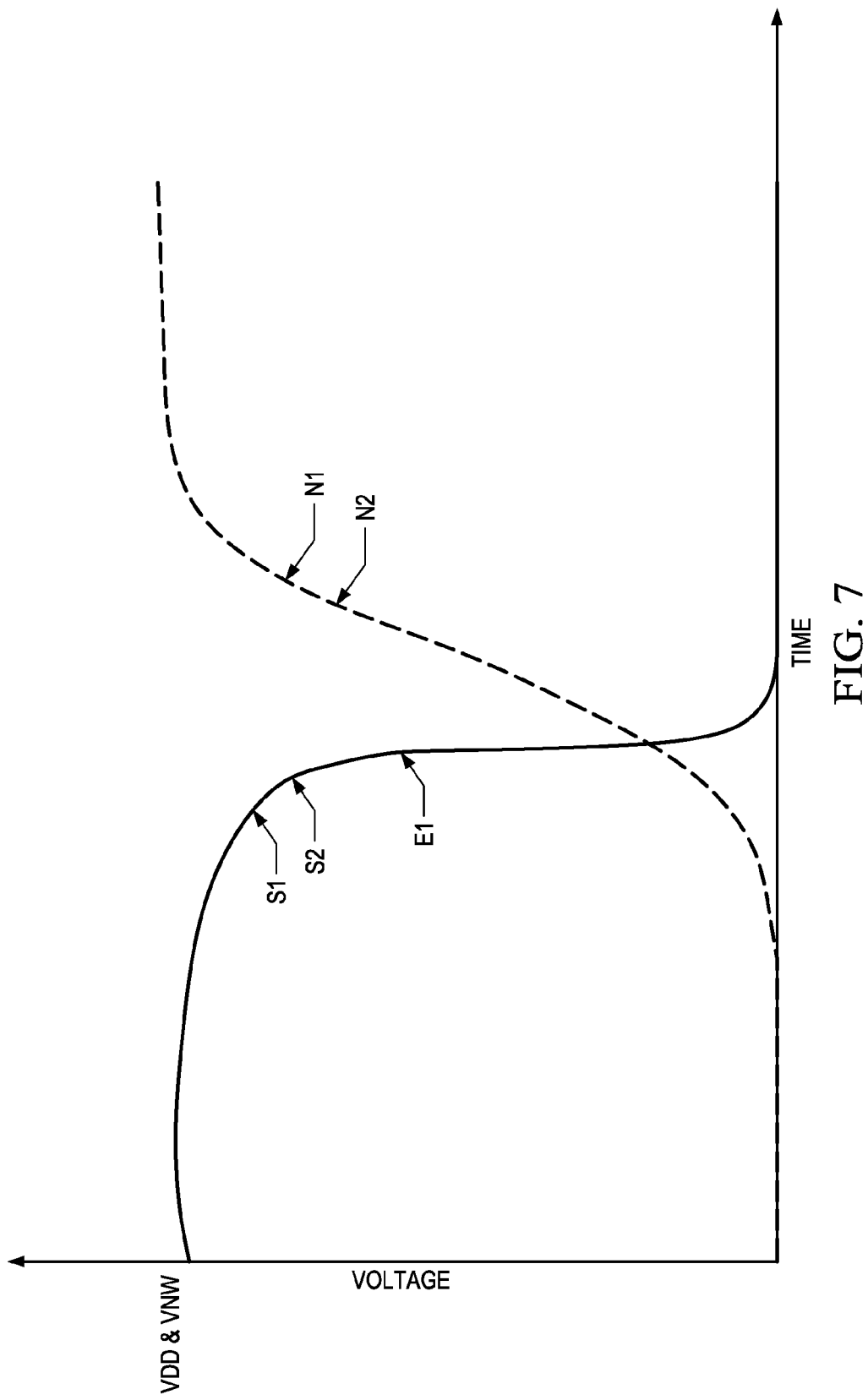
FIG. 7 is timing diagram illustrating the timing of the signals S1 and E1 used to charge node N1 and N2 according to an embodiment of the invention.

FIG. 7 is timing diagram illustrating the timing of the signals S1 and E1 used to charge node N1 and N2 according to an embodiment of the invention. In order to prevent latch-up, E1 is driven to a logical zero at approximately the same time as signal S1 is driven to a logical zero. Because E1 is driven to a logical zero at approximately the same time as signal S1 is driven to a logical zero, nodes N1 and N2 are driven to approximately the same voltage at approximately the same time. In this example, voltage VNW is approximately the same value as VDD. Because the Nwells N2 of the SRAM array 302 and the positive node N1 of the SRAM array 302 are driven to approximately the same voltage at approximately the same time, latch-up will not occur.

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A circuit for providing power to a static random access memory (SRAM) array without causing latch-up comprising:
   a first PFET, the first PFET having a source, a drain and a gate wherein the drain of the first PFET is connected to a positive voltage node in the SRAM array, the source of the first PFET is connected to a first power supply and the gate of the first PFET is connected to a first control signal;
   a second PFET, the second PFET having a source, a drain and a gate wherein the drain of the second PFET is connected to at least one Nwell in the SRAM array, the source of the second PFET is connected to a second power supply and the gate of the second PFET is connected to the first control signal; and
   a third PFET, the third PFET having a source, a drain and a gate wherein the drain of the third PFET is connected to the least one Nwell in the SRAM array, the source of the third PFET is connected to the positive voltage node in the SRAM array and the gate of the third PFET is connected to a second control signal.

2. The circuit of claim 1 wherein the second control signal is driven to a logical low level before the first control signal is driven to a logical low level.

3. The circuit of claim 1 wherein the first and second control signals are driven to a logical low level at approximately the same time.

4. A circuit for providing power to a static random access memory (SRAM) array without causing latch-up comprising:
   a first PFET, the first PFET having a source, a drain and a gate wherein the drain of the first PFET is connected to a positive voltage node in the SRAM array, the source of the first PFET is connected to a first power supply and the gate of the first PFET is connected to a first control signal;
   a second PFET, the second PFET having a source, a drain and a gate wherein the drain of the second PFET is connected to all Nwells in the SRAM array, the source of the second PFET is connected to a second power supply and the gate of the second PFET is connected to the first control signal; and
   a third PFET, the third PFET having a source, a drain and a gate wherein the drain of the third PFET is connected to all Nwells in the SRAM array, the source of the third PFET is connected to the positive voltage node in the SRAM array and the gate of the third PFET is connected to a second control signal.

5. The circuit of claim 1 wherein the second control signal is driven to a logical low level before the first control signal is driven to a logical low level.

6. The circuit of claim 1 wherein the first and second control signals are driven to a logical low level at approximately the same time.

* * * * *